(12) United States Patent
Bae et al.

(10) Patent No.: US 11,017,199 B2
(45) Date of Patent: May 25, 2021

(54) DISPLAY DEVICE WITH INTEGRATED SENSOR OPENING

(71) Applicant: Samsung Display Co., Ltd., Yongin-si (KR)

(72) Inventors: Jong Man Bae, Hwaseong-si (KR); Se Hun Park, Cheonan-si (KR); Chang Mo Park, Seoul (KR); So Yeon Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/413,602

(22) Filed: May 16, 2019

(65) Prior Publication Data

US 2019/0377925 A1 Dec. 12, 2019

(30) Foreign Application Priority Data

Jun. 7, 2018 (KR) .......................... 10-2018-0065427
Apr. 5, 2019 (KR) .......................... 10-2019-0040242

(51) Int. Cl.
*G06K 9/00* (2006.01)
*H01L 51/52* (2006.01)
*H01L 25/18* (2006.01)

(52) U.S. Cl.
CPC ....... *G06K 9/0004* (2013.01); *G06K 9/00087* (2013.01); *H01L 25/18* (2013.01); *H01L 51/529* (2013.01); *H01L 51/5246* (2013.01); *H01L 51/5284* (2013.01)

(58) Field of Classification Search
CPC ......................... G06F 1/1696; G06K 9/0004; G06K 9/00087; H01L 27/3234; H01L 25/18; H01L 25/5284; H01L 51/529; H01L 51/5246
USPC ......................................................... 345/173
See application file for complete search history.

(56) References Cited

U.S. PATENT DOCUMENTS

| 2011/0267298 A1* | 11/2011 | Erhart ................... G06F 1/1696 345/173 |
| 2017/0300736 A1* | 10/2017 | Song ..................... G06K 9/0004 |
| 2020/0143134 A1* | 5/2020 | Wang ................... H01L 27/3234 |

FOREIGN PATENT DOCUMENTS

| KR | 10-1724305 | 4/2017 |
| KR | 10-1727474 | 4/2017 |
| KR | 10-1765464 | 8/2017 |
| KR | 10-1821980 | 3/2018 |

* cited by examiner

*Primary Examiner* — Abdul-Samad A Adediran
(74) *Attorney, Agent, or Firm* — H.C. Park & Associates, PLC

(57) ABSTRACT

A display device includes: a display panel having a display area; a protective cover disposed on a surface of the display panel in a position overlapping the display area, the protective cover having an opening overlapping the display area and extending in a thickness direction opposite from the display panel, the protective cover including a first layer; and a fingerprint sensor disposed at least partially in the opening.

24 Claims, 18 Drawing Sheets

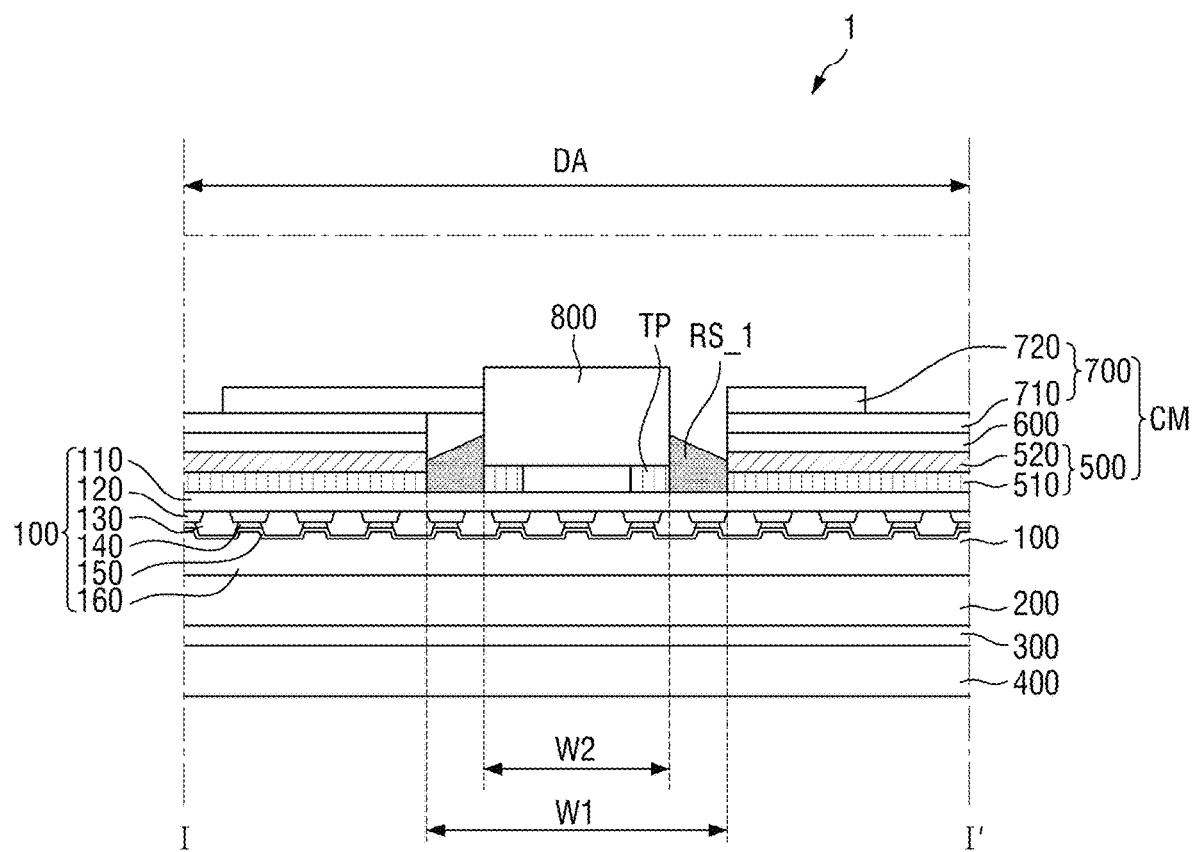

DISPLAY DEVICE WITH INTEGRATED SENSOR OPENING

CROSS REFERENCE TO RELATED APPLICATIONS

This application claims priority from and the benefit of Korean Patent Application No. 10-2018-0065427, filed on Jun. 7, 2018 and Korean Patent Application No. 10-40040242, filed on Apr. 5, 2019, each of which is hereby incorporated by reference for all purposes as if fully set forth herein.

BACKGROUND

Field

Exemplary implementations of the invention relate generally to a display device and, more particularly, to a display device having an opening in the integrated in the display area of the device.

Discussion of the Background

Organic light emitting displays have advantages in luminance, driving voltage, and response speed characteristics and can be multi-colored. Due to these advantages, the organic light emitting displays are being applied to various products, including smartphones. An organic light emitting display includes a display panel including an organic light emitting element. In the organic light emitting element, a cathode and an anode are arranged around an organic light emitting layer. When a voltage is applied to both electrodes, visible light is generated from the organic light emitting layer connected to both electrodes.

A protective layer having substantially the same size as the display panel may be disposed under the display panel. The protective layer can protect the display panel from contamination, scratches and impacts that may occur in the process of manufacturing the display device. The protective layer may be formed directly below the display panel in the form of a print layer.

With the advent of fingerprint and other types of sensors for use in mobile phones and the like, holes need to be made in the device to accommodate the sensor(s), But, the holes can interrupt electrical connections and the integrity of the device. For this reason, holes to accommodate sensors typically have been made in the non-display area of the device The above information disclosed in this Background section is only for understanding of the background of the inventive concepts, and, therefore, it may contain information that does not constitute prior art.

SUMMARY

Display devices constructed according to exemplary implementations of the invention are capable of integrating holes to accommodate one or more sensors in the display area of the display device to reduce the visibility of a sensor attachment portion, such as for a fingerprint sensor. Thus, a fingerprint sensor area constructed according to the principles and exemplary implementations of the invention may display an image, and, when the fingerprint of the user needs to be recognized, may also be used as an area for recognizing the fingerprint of the user.

The sensor attachment portion constructed according to the principles and exemplary implementations of the invention may include a protective layer in the form of a tape and a stepped shoulder structure formed by layers of a cover member to facilitate mounting and/or alignment of the sensor in the display area without interrupting the electrical or structural integrity of the display device.

Incorporation of one or more sensing areas in the display area of a display device according to the principles and exemplary implementation of the invention, instead of the non-display area, allows the non-display area to be reduced, thereby reducing the bezel and realizing more or substantially all of the display panel as the display area to more efficiently utilize available space.

Additional features of the inventive concepts will be set forth in the description which follows, and in part will be apparent from the description, or may be learned by practice of the inventive concepts.

According to one or more embodiments of the invention, a display device includes: a display panel having a display area; a protective cover disposed on a surface of the display panel in a position overlapping the display area, the protective cover having an opening overlapping the display area and extending in a thickness direction opposite from the display panel, the protective cover including a first layer; and a fingerprint sensor disposed at least partially in the opening.

The opening may expose at least a part of the surface of the display panel, and wherein the fingerprint sensor may have a surface directly facing the display panel without any intervening layers.

The surface of the fingerprint sensor may be directly disposed on the display panel.

The surface of the fingerprint sensor may be spaced away from the display panel by an air gap.

The protective cover may include a first adhesive layer disposed on a surface of the first layer facing the display panel.

The first layer may include a light shielding pigment.

The display panel may include a plurality of light emitting elements, and wherein the fingerprint sensor may be configured to recognize a fingerprint of a user using the light emitted from the organic light emitting elements.

At least a part of the fingerprint sensor may be inserted into the opening, facing the display panel.

The display device may further include an adhesive member attaching the fingerprint sensor to the surface of the display panel, wherein the adhesive member may be spaced apart from sidewalls of the opening.

The protective cover may further include a second layer disposed on a surface of the first layer.

The opening may include a first opening formed in the first layer and a second opening formed in the second layer, wherein the first opening may have a planar surface area smaller than that of the fingerprint sensor, and wherein the second opening may have a planar surface area the same as that of the fingerprint sensor.

The display device may further include a shoulder between the first and second layers, wherein the fingerprint sensor may be attached to the shoulder.

The protective cover may include a cover member including the first layer, which includes protective tape, and the second layer which includes a cushioning member including at least one of a heat dissipation member and a latent heat member.

The protective cover may further include a third opening overlapping the display area.

At least one optical sensor may be received in the third opening.

According to one or more embodiments of the invention, a display device includes: a display panel having a display area; a protective cover disposed on a surface of the display panel, the protective cover including a first layer overlapping the display area; and a fingerprint sensor disposed on a surface of the protective cover, wherein the first layer may include a first area and a second area surrounding the first area, the first area being a light transmitting area, and wherein the fingerprint sensor may be disposed overlapping the first area.

The second area may be an opaque area.

The protective cover may include a first adhesive layer disposed on a surface of the first layer facing the display panel.

The display panel may include a plurality of light emitting elements, and wherein the fingerprint sensor may be configured to recognize a fingerprint of a user's finger positioned on the display panel using the light emitted from the organic light emitting elements.

At least a part of the fingerprint sensor may be inserted into the protective cover overlapping the first area.

The display device may further include a second layer disposed on the surface of the protective cover, the second layer including an opening overlapping the first area.

The first layer may further include a second adhesive layer overlapping the second area facing the second layer, wherein the first area may have a planar surface area smaller than that of the fingerprint sensor, and the opening has a planar surface area same as that of the fingerprint sensor.

The first layer may include a non-overlap area which does not overlap with the second layer, and the fingerprint sensor is attached to the non-overlap area of the protective cover.

The protective cover may include a cover member including the first layer, which includes protective tape, and the second layer which includes a cushioning member including at least one of a heat dissipation member and a latent heat member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 3B is a cross-sectional view of the display device constructed according to another exemplary embodiment of the invention of FIG. 2, taken along sectional line I-I'.

DETAILED DESCRIPTION

Figure 1:
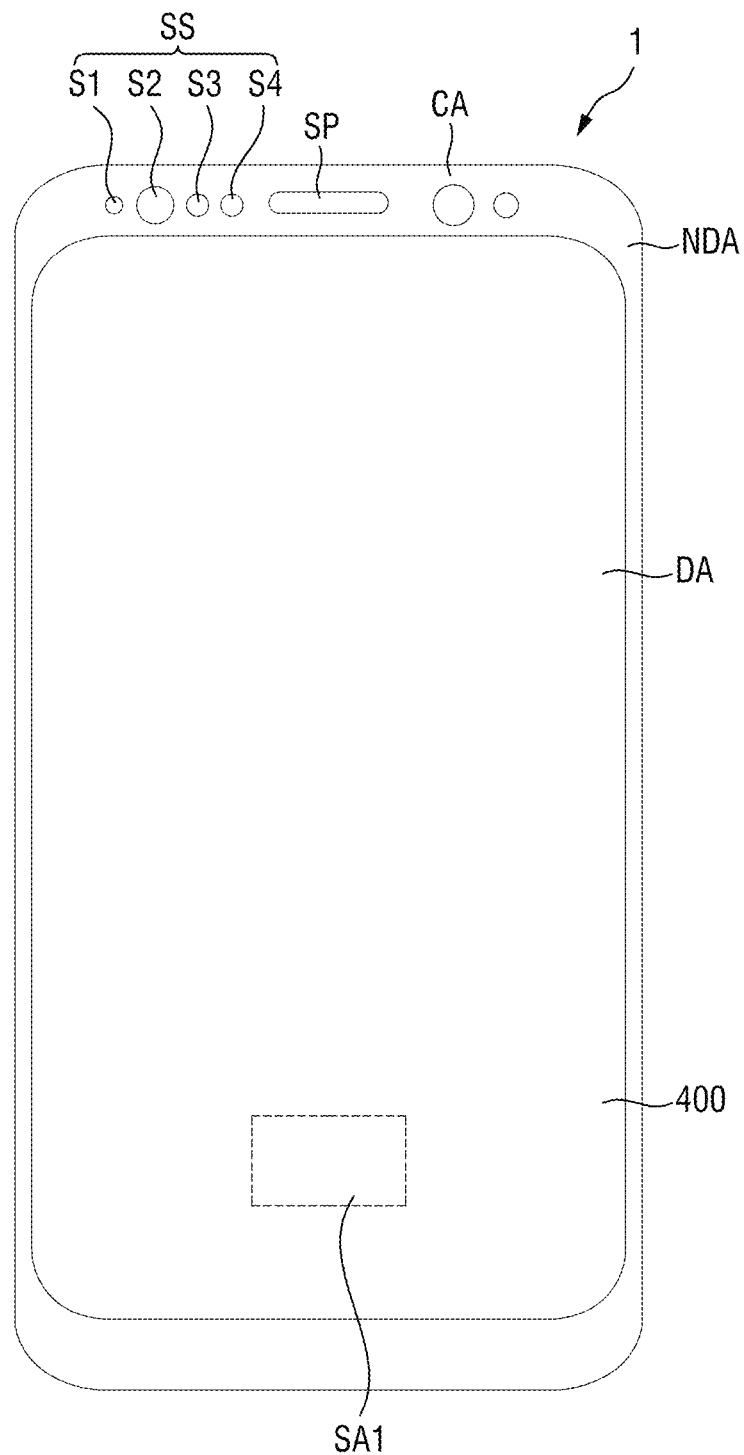
FIG. 1 is a plan view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device 1 constructed according to an exemplary embodiment of the invention.

Referring to FIG. 1, the display device 1 may be divided into a display area DA and a non-display area NDA.

The display area DA is defined as an area for displaying an image. The planar shape of the display area DA may be a rectangular shape or a rectangular shape with rounded corners. The planar shape of the display area DA is not limited to the rectangular shape, but may also be a circular shape, an elliptical shape, or various other shapes.

In addition, the display area DA may be used as a detection member or a sensor for detecting or sensing the external environment. In an exemplary embodiment, at least a part of the display area DA may be defined as a fingerprint recognition area SA1 for recognizing a fingerprint of a user. That is, the fingerprint recognition area SA1 may display an image, and, when the fingerprint of the user needs to be recognized, may also be used as an area for recognizing the fingerprint of the user. A fingerprint sensor 800 is disposed in the fingerprint recognition area SA1 to overlap the fingerprint recognition area SA1. The fingerprint recognition area SA1 may overlap an opening OP of a protective cover member which may include protective tape 500 and a cushioning tape 600, to as described later.

The non-display area NDA is disposed outside the display area DA and defined as an area that does not display an image. According to the illustrated embodiment, a speaker module SP, a camera module CA, and a sensor module SS may be disposed in the non-display area NDA. The sensor module SS may, in an exemplary embodiment, include at least one of an illuminance sensor S1, a proximity sensor S2, an infrared sensor S3, and an ultrasonic sensor S4. In an exemplary embodiment, the sensor module SS may perform a function of recognizing a user's iris. The arrangement of the speaker module SP, the camera module CA, and the sensor module SS is not limited to the exemplary embodiment illustrated in FIG. 1.

Figure 2:
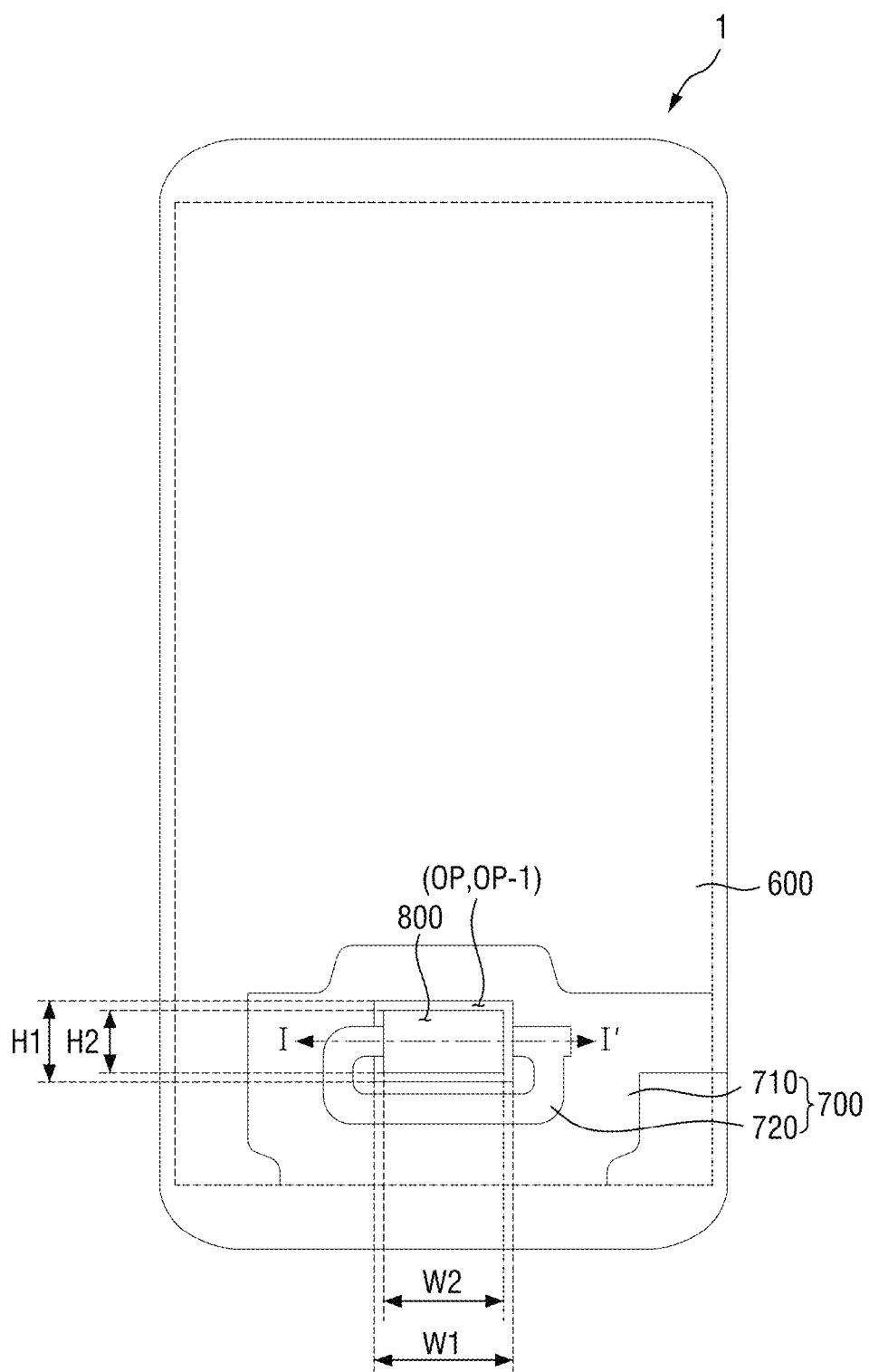
FIG. 2 is a bottom view of the display device of FIG. 1.
Figure 3A:
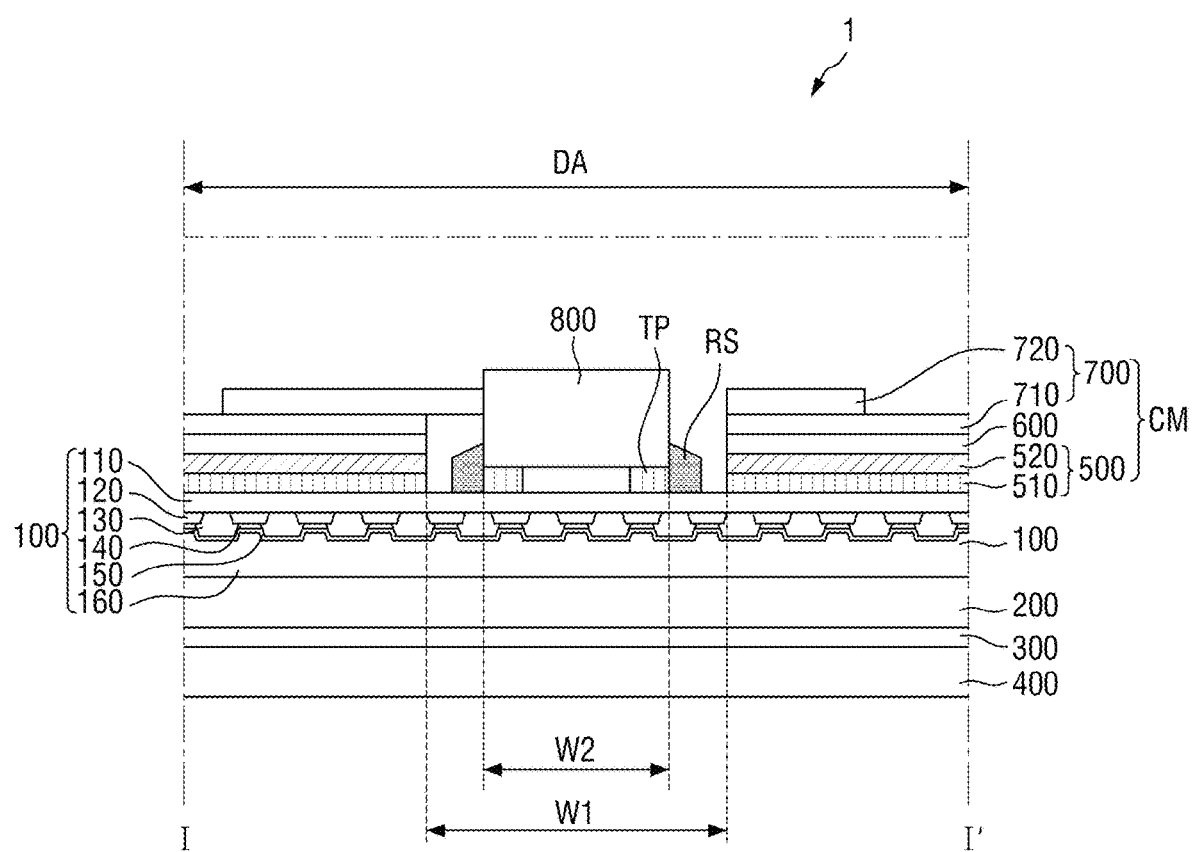
FIG. 3A is a cross-sectional view of the display device of FIG. 2, taken along sectional line I-I'.

FIG. 2 is a bottom view of the display device 1 of FIG. 1, and FIG. 3A is a cross-sectional view of the display device 1 of FIG. 2, taken along sectional line I-I'. FIG. 3B is a cross-sectional view of the display device constructed according to another exemplary embodiment of the invention of FIG. 2, taken along sectional line I-I'.

Referring to FIGS. 2, 3A, and 3B, the display device 1 includes a display panel 100, a touch member 200, an adhesive member 300, a cover window 400, the protective tape 500, the cushioning tape 600, a flexible circuit board 700, and the fingerprint sensor 800.

First, the display panel 100 will be described in more detail.

The display panel 100 is a panel for displaying a screen and may include a plurality of pixels. The display panel 100 may be, for example, an organic light emitting display panel, a liquid crystal display panel, or an electrophoretic display panel. For example, the exemplary embodiment of FIGS. 2 and 3 illustrate the case where the display panel 100 is an organic light emitting display panel, but the exemplary embodiments are not limited thereto.

The display panel 100 may include a substrate 110, a plurality of pixel electrodes 120, a pixel defining layer 130, a plurality of organic light emitting layers 140, a common electrode 150, and an encapsulation layer 160.

The substrate 110 may be an insulating substrate. The substrate 110 may include a material such as glass, quartz, or polymer resin. In an exemplary embodiment, the substrate 110 may be a rigid substrate made of glass. However, the substrate 110 may also include a flexible material such as polyimide.

The pixel electrodes 120 are disposed on the substrate 110. The pixel electrodes 120 may be disposed in the pixels. For example, one pixel electrode 120 may be disposed in each pixel. Also, two or more pixel electrodes 120 may be disposed in one pixel, or two or more pixels may share one pixel electrode 120.

A plurality of elements may be further disposed between the substrate 110 and the pixel electrodes 120. In an exemplary embodiment, the elements may include a buffer layer, a plurality of conductive wirings, an insulating layer, and a plurality of thin-film transistors.

Each pixel electrode 120 may be an anode of an organic light emitting element. When formed as an anode, each pixel electrode 120 may include a material having a work function greater than that of the common electrode 150. For example, each pixel electrode 120 may include one or more of indium tin oxide (ITO), indium zinc oxide (IZO), zinc oxide (ZnO), indium oxide (In2O3), indium gallium oxide (IGO), and aluminum zinc oxide (AZO). When the display panel 100 is a top emission panel, each pixel electrode 120 may further include a reflective material layer disposed below the above conductive layer having a relatively greater work function. The reflective material layer may include one or more of silver (Ag), magnesium (Mg), chromium (Cr), gold (Au), platinum (Pt), nickel (Ni), copper (Cu), tungsten (W), and aluminum (Al).

The pixel defining layer 130 may be disposed on the pixel electrodes 120. The pixel defining layer 130 may be disposed along boundaries of the pixels. The pixel defining layer 130 may include openings exposing at least a part of the pixel electrodes 120, respectively. The pixel defining layer 130 may include an organic material, an inorganic material, or a laminate of an organic material layer and an inorganic material layer. When the pixel defining layer 130 includes an organic material, it may include a material such as photoresist, polyimide resin, acrylic resin, a silicon compound, or polyacrylic resin.

The organic light emitting layers 140 may be disposed on the pixel electrodes 120 exposed by the pixel defining layer 130. In an exemplary embodiment, the organic light emitting layers 140 may contact at least a part of sidewalls of the pixel defining layer 130.

The organic light emitting layers 140 may emit light of different colors in different pixels. For example, an organic light emitting layer 140 of a red pixel may include a red light emitting layer, an organic light emitting layer 140 of a green pixel may include a green light emitting layer, and an organic light emitting layer 140 of a blue pixel may include a blue light emitting layer.

In an exemplary embodiment, the organic light emitting layers 140 may emit white light. For example, each of the organic light emitting layers 140 may include a white light emitting material or may have a laminated structure of a red light emitting layer, a green light emitting layer and a blue light emitting layer to emit white light. In this case, a color filter may be placed in the path of light emitted from each of the organic light emitting layers 140 to represent the color of a corresponding pixel.

The common electrode 150 is disposed on the organic light emitting layers 140. The common electrode 150 may be a whole-plate electrode formed entirely without distinction between pixels. The common electrode 150 may be disposed not only on the organic light emitting layers 140 but also on an upper surface of the pixel defining layer 130.

The common electrode 150 may be a cathode of each organic light emitting element. The common electrode 150 may include a material having a work function smaller than those of the pixel electrodes 120. For example, the common electrode 150 may include any one or more of Li, Ca, Li/Ca, LiF/Al, Al, Ag, and Mg. When the display panel 100 is a top emission panel, the common electrode 150 may include a thin conductive layer and a transparent conductive layer laminated on the thin conductive layer. The thin conductive layer may include the above-mentioned material having a small work function, but can at least partially transmit visible light because it is formed as a thin layer. The transparent conductive layer laminated on the thin conductive layer may serve to maintain light transmittance in a front direction at a certain level while lowering the resistance of the common electrode 150. The transparent conductive layer may be, but is not limited to, indium tin oxide (ITO), indium zinc oxide (IZO), zinc oxide (ZnO), indium oxide (In2O3), indium gallium oxide (IGO), or aluminum zinc oxide (AZO).

Each pixel electrode 120, each organic light emitting layer 140, and the common electrode 150 described above may constitute an organic light emitting element OLED.

A hole injection layer HIL and/or a hole transport layer HTL may be disposed between each pixel electrode 120 and each organic light emitting layer 140, and an electron transport layer ETL and/or an electron injection layer EIL may be disposed between each organic light emitting layer 140 and the common electrode 150. At least one of the hole injection layer HIL, the hole transport layer HTL, the electron transport layer ETL and the electron injection layer EIL may be, but is not limited to, formed as a common layer disposed entirely without distinction between pixels.

The encapsulation layer 160 is disposed on the common electrode 150. The encapsulation layer 160 may include an inorganic layer. The encapsulation layer 160 may further include an organic layer. For example, the encapsulation layer 160 may include a first inorganic layer, an organic layer disposed on the first inorganic layer, and a second inorganic layer disposed on the organic layer. The encapsulation layer 160 may prevent or reduce moisture and air that may be introduced from the outside from penetrating into the organic light emitting element OLED.

In an exemplary embodiment, an encapsulation substrate made of glass or the like may be disposed on the common electrode 150, instead of the encapsulation layer 160. The encapsulation substrate may be attached onto the common electrode 150 by an adhesive layer or a resin layer.

The cover window 400 may be disposed above the display panel 100. The cover window 400 may be disposed above the display panel 100 to protect the display panel 100 while transmitting light emitted from the display panel 100.

The cover window 400 may include, but is not limited to, transparent glass or a transparent material such as polyethylene terephthalate, polyvinyl resin or polyester. The type of the cover window 400 is not limited as long as the cover window 400 has a transmittance sufficient to transmit light emitted from the display panel 100.

The cover window 400 may overlap the display panel 100 and cover the entire surface of the display panel 100. The cover window 400 may be larger than the display panel 100. For example, at both short sides of the display device 1, the cover window 400 may protrude outward from the display panel 100. The cover window 400 may also protrude from the display panel 100 at both long sides of the display device 1, but the protruding distance may be greater at both short sides.

The touch member 200 may be disposed between the display panel 100 and the cover window 400. The touch member 200 may be disposed on the entire surface of the display panel 100. That is, the touch member 200 may have substantially the same size as the display panel 100 and overlap the display panel 100.

In an exemplary embodiment, the touch member 200 may be manufactured as a separate panel from the display panel 100 and then placed on the display panel 100. In this case, the display panel 100 and the touch member 200 may be bonded together by an optical clear adhesive (OCA) or an optical clear resin (OCR).

In an exemplary embodiment, the touch member 200 may be integrated in the structure of the display panel 100. For example, the touch member 200 may be formed by forming a touch electrode on an insulating layer of the display panel 100.

The touch member 200 and the cover window 400 may be bonded together by the adhesive member 300 such as an OCA or an OCR. The adhesive member 300 may have a refractive index similar to that of the cover window 400. If the refractive indices of the adhesive member 300 and the cover window 400 are similar, the reflection of light due to the difference in refractive index can be minimized or reduced. In addition, the adhesive member 300 may be formed to have a relatively higher elasticity than the cover window 400. When the elasticity of the adhesive member 300 is relatively high, the display panel 100 can be protected from an external impact.

A cover member CM may be disposed on a lower surface of the display panel 100. The cover member CM may include the protective tape 500 and the cushioning tape 600, and the flexible circuit board 700.

The protective tape 500 may be disposed on the lower surface of the display panel 100. Here, the lower surface of the display panel 100 may be a lower surface of the substrate 110. That is, the protective tape 500 may be disposed directly on a back surface of the substrate 110. The protective tape 500 may include the opening OP in which the fingerprint sensor 800 to be described later will be placed. The opening OP may overlap the fingerprint recognition area SA1.

The protective tape 500 may include a protective layer 520 and a first adhesive layer 510. The protective layer 520 and the first adhesive layer 510 may each include the opening OP for placement of the fingerprint sensor 800.

The protective layer 520 may protect the display panel 100 from an external impact occurring under the display panel 100. For example, the protective layer 520 may protect the display panel 100 from contamination, scratches, and impacts that may occur in the process of manufacturing the display device 1. The protective layer 520 may contain components such as fine-powdered silica, a silicone-based antifoaming agent, an additive, an antistatic agent, a naphtha solvent, diethylene glycol mono, and ethyl ether acetate.

The first adhesive layer 510 may be disposed between the substrate 110 of the display panel 100 and the protective layer 520. The first adhesive layer 510 may serve to attach the protective layer 520 to the lower surface of the substrate 110. The first adhesive layer 510 and the protective layer 520 may completely overlap each other. That is, the first adhesive layer 510 and the protective layer 520 may have the same planar shape.

In some exemplary embodiments, the first adhesive layer 510 may contain a polymer material such as a silicone polymer, a urethane polymer, an SU polymer of a silicone-urethane structure, an acrylic polymer, an isocyanate polymer, a polyvinyl alcohol polymer, a gelatin polymer, a vinyl polymer, a latex polymer, a polyester polymer, or a water-based polyester polymer.

The cushioning tape 600 may be disposed on a lower surface of the protective tape 500. The cushioning tape 600 may have an adhesive layer on at least one surface thereof and may be attached to a lower surface of the protective tape 500 by the adhesive layer. The cushioning tape 600 may include an opening OP-1 overlapping the opening OP of the protective tape 500 for the placement of the fingerprint sensor 800. The cushioning tape 600 and the protective tape 500 may completely overlap each other.

The cushioning tape 600 may include a buffer member capable of absorbing external impact. The buffer member may include a shock-absorbing material. In an exemplary embodiment, the buffer member may be a sponge formed by foaming an elastic polymer resin, a rubber liquid, a urethane-based material, or an acrylic-based material.

In addition to the buffer member, the cushioning tape 600 may further include a light shielding member that prevents or reduces light emitted from the display panel 100 from leaking to under the display panel 100 and/or a heat dissipation member that can dissipate heat generated in the display device 1. The heat dissipation member may include a metal having excellent thermal conductivity, such as copper (Cu), silver (Ag), a copper alloy or aluminum (Al) or may include a carbon-based material such as graphite or graphene. The buffer member, the light shielding member, and the heat dissipation member may be laminated in a thickness direction of the display panel.

A flexible circuit board 700 includes a first flexible circuit board 710 and a second flexible circuit board 720. The first flexible circuit board 710 may be disposed in the vicinity of one edge of the display device 1. A driver chip for driving the touch member 200 may be mounted on the first flexible circuit board 710. The first flexible circuit board 710 may be attached to one side of the touch member 200 to electrically connect the driver chip and the touch member 200. The first flexible circuit board 710 may be bent toward below the display panel 100 and placed on a back surface of the cushioning tape 600 to overlap the back surface of the cushioning tape 600. The first flexible circuit board 710 may be bonded to, or otherwise integrated with, the back surface of the cushioning tape 600 by an adhesive layer or the like in the overlap area with the cushioning tape 600.

The second flexible circuit board 720 may be disposed on the cushioning tape 600 and the first flexible circuit board 710. The second flexible circuit board 720 may provide a signal for driving the fingerprint sensor 800. A driver chip for driving the fingerprint sensor 800 may be mounted on the second flexible circuit board 720, and the second flexible circuit board 720 may be electrically connected to the first flexible circuit board 710. The second flexible circuit board 720 may be at least partially bonded to the first flexible circuit board 710 by a double-sided tape or the like.

The fingerprint sensor 800 may be disposed in the openings OP and OP-1. The fingerprint sensor 800 may directly face the substrate 110. The fingerprint sensor 800 may be, for example, an optical sensor using light emitted from a plurality of organic light emitting elements of the display panel 100. Alternatively, a product that performs a sensing function using light may be applied to the fingerprint sensor 800.

The fingerprint sensor 800 will now be described in detail with reference to FIG. 4.

Figure 4:
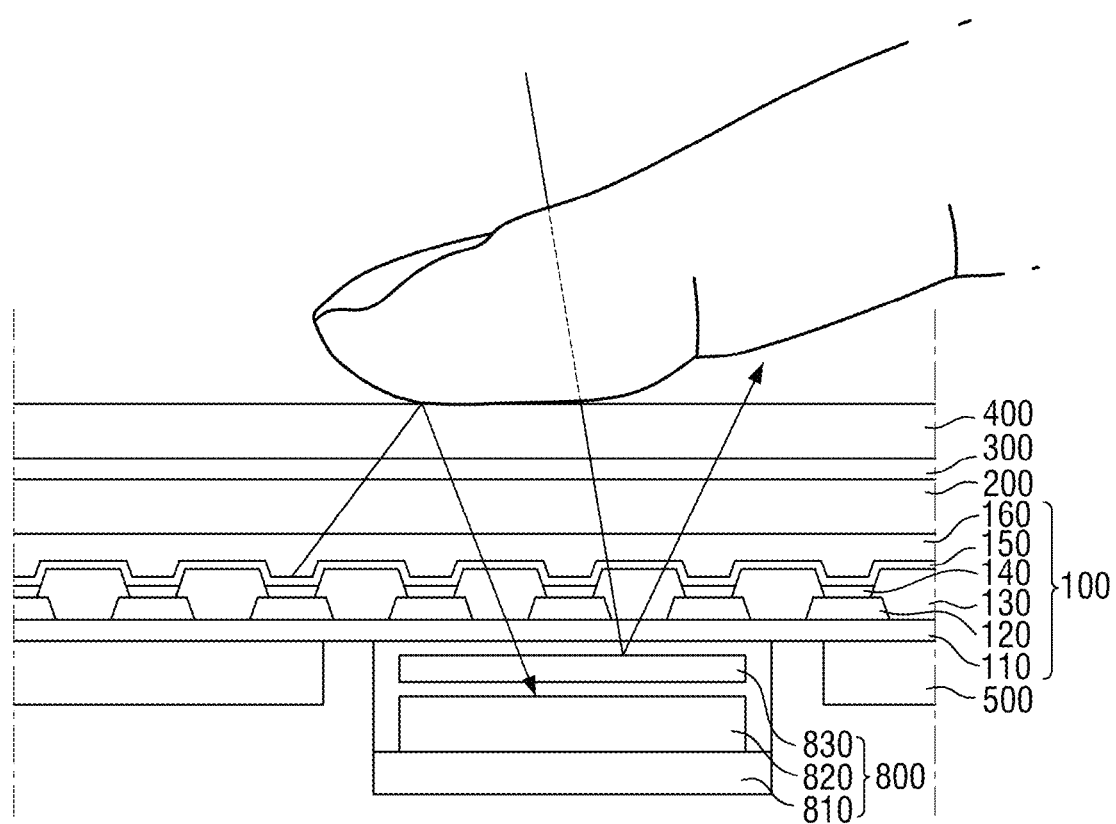
FIG. 4 is a schematic sectional diagram for explaining, in detail, a fingerprint recognition method of the display device according to an exemplary embodiment.

FIG. 4 is a schematic sectional diagram for explaining, in detail, a fingerprint recognition method of the display device 1 according to an exemplary embodiment.

Referring to FIG. 4, the fingerprint sensor 800 may include a sensor base 810, an image sensor 820, and an infrared filter 830. The fingerprint sensor 800 may be placed in the opening OP of the protective tape 500 by attaching the fingerprint sensor 800 onto the substrate 110 using any means known in the art including a double-sided tape TP and a resin RS. Light emitted from the organic light emitting layers 140 may be provided to a user's finger. Of the light emitted from the organic light emitting layers 140, light reflected from the user's finger may be received by the image sensor 820. The reflected light may travel to the image sensor 820 through the openings OP and OP-1, and reflected light or external light in other areas irrelevant to this area may be blocked by the protective layer 520 or the light shielding member of the cushioning tape 600. Therefore, sensing noise of the image sensor 820 can be reduced.

Light emitted from a light source other than the display device 1 may include light in a long-wavelength infrared region. The infrared filter 830 filters the light in the infrared region by absorbing and/or reflecting the light in order to prevent or reduce the infrared light from entering the image sensor 820. Thus, the image sensor 820 can recognize the fingerprint of the user more clearly based on the infrared-free light provided from the finger. A fingerprint of a finger includes relatively protruding ridges and relatively concave valleys and may form a pattern unique to each individual. The image sensor 820 may form image information necessary for fingerprint recognition using received light and store the image information in a memory inside the fingerprint sensor 800.

Figure 5:
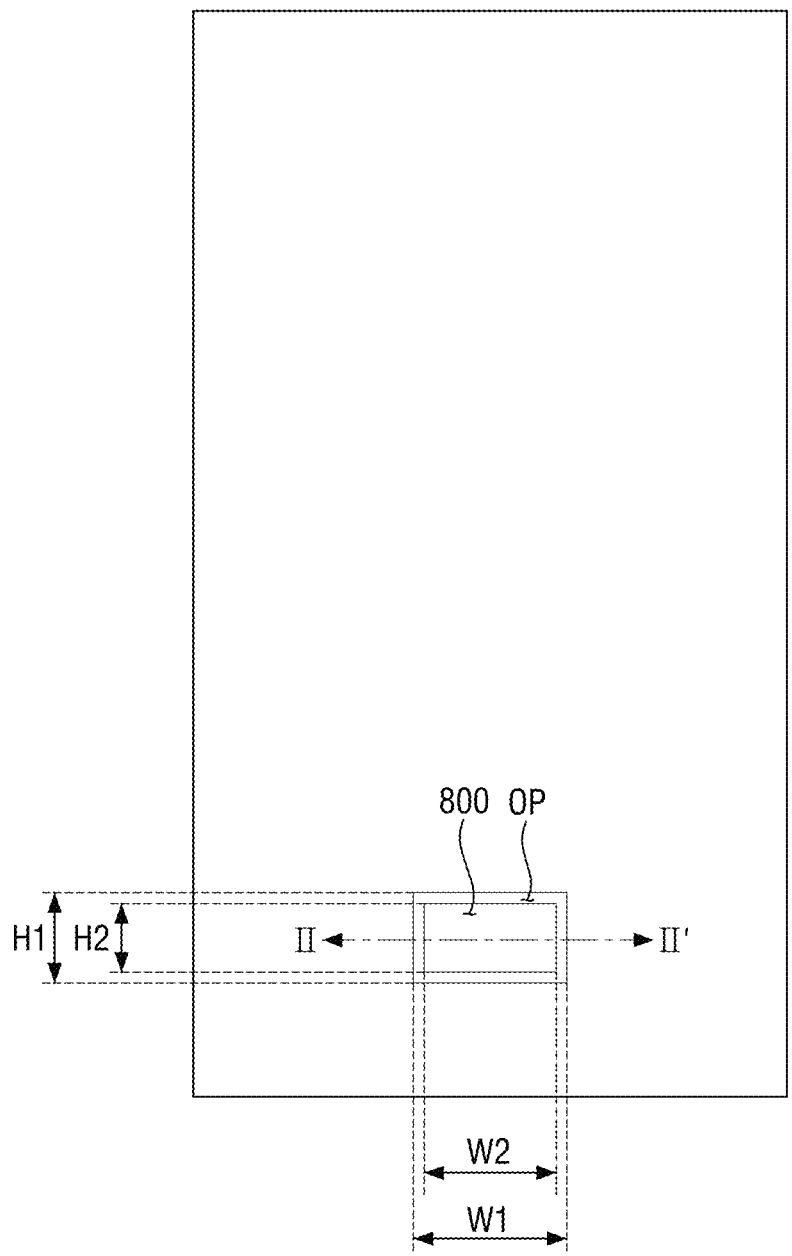
FIG. 5 is a plan view of a protective tape constructed according to an exemplary embodiment of the invention.
Figure 6:
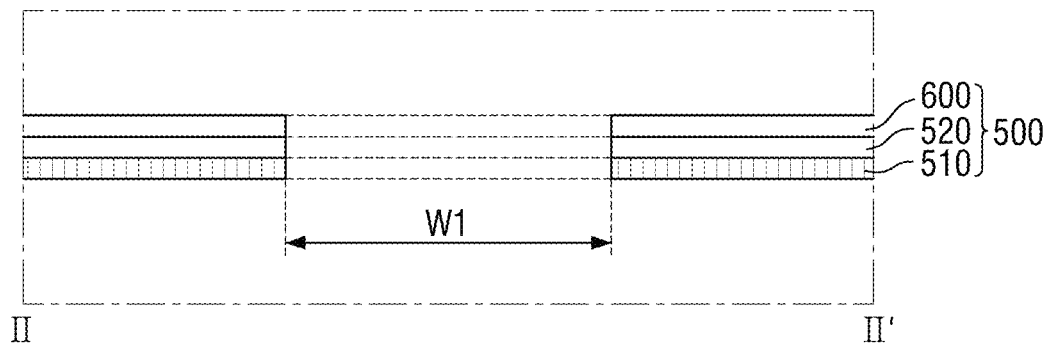
FIG. 6 is a cross-sectional view of the protective tape taken along sectional line II-II' of FIG. 5.

FIG. 5 is a plan view of the protective tape 500 construed according to an exemplary embodiment of the invention, and FIG. 6 is a cross-sectional view of the protective tape 500 taken along sectional line II-II' of FIG. 5.

Referring to FIGS. 5 and 6, a width W1 and a length H1 of the opening OP formed in the protective tape 500 and the cushioning tape 600 may be greater than a width W2 and a height H2 of the fingerprint sensor 800. The lower surface of the substrate 110 may be exposed by the opening OP formed in the protective tape 500 and the cushioning tape 600 and may directly face the fingerprint sensor 800. In addition, the fingerprint sensor 800 and the opening OP may be spaced apart from each other by a predetermined gap. Therefore, the protective tape 500 may not overlap adhesive members such as the double-sided tape TP and a resin RS bonded to the fingerprint sensor 800. That is, when the protective tape 500 is removed from the substrate 110, it can be easily removed without being disturbed by the adhesive members.

However, the opening OP may be filled with the resin RS_1. Referring to FIG. 3B, A space between the fingerprint sensor 800 and/or the double-sided tape ST and the protective tape 500 may be filled with an adhesive member such as the resin RS_1. Herein, the resin RS_1 may be a black resin. The black resin may comprise polyamic acid and polyimide; acrylate-, epoxy-, siloxane-, ester- or styrene-based monomer itself, or its oligomer or polymer. Also, the black resin having the black-colored additive can comprise the above-mentioned organic composition. As a result, the light inflow from the outside may be prevented or suppressed, and the visibility of the fingerprint sensor 800 may be prevented or suppressed.

Hereinafter, display devices according to another exemplary embodiments will be described. In the following embodiments, elements identical to those of the exemplary embodiment described above will not be described or will be described, focusing mainly on differences, to avoid redundancy.

Figure 7:
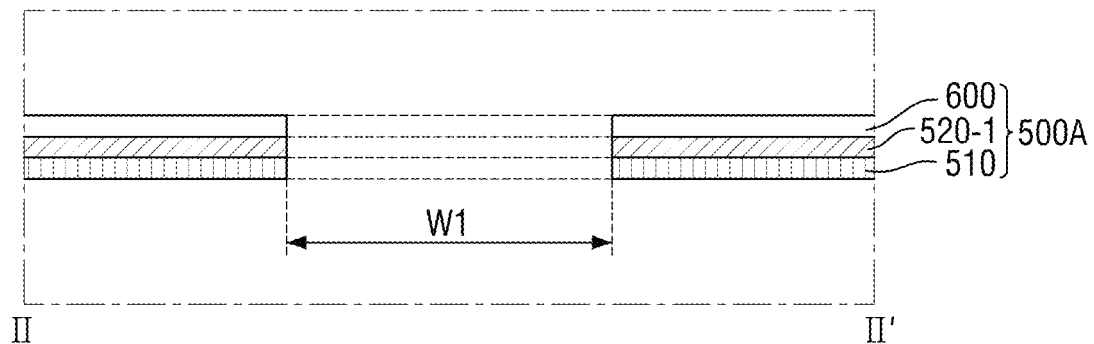
FIG. 7 is a cross-sectional view of another embodiment of a protective tape taken along the sectional line II-II' of FIG. 5.

FIG. 7 is a cross-sectional view of another embodiment of a protective tape 500A taken along the sectional line II-II' of FIG. 5.

Referring to FIG. 7, the protective tape 500A according to the illustrated embodiment is different from the embodiment of FIG. 6 in that a protective layer 520-1 further includes a light shielding pigment.

More specifically, since the protective layer 520-1 includes the light shielding pigment, the protective tape 500A can prevent or reduce light emitted from a display panel 100 from leaking to under the display panel 100. That is, the protective layer 520-1 not only protects the display panel 100 from an external impact occurring in a process, but also performs a function of blocking light emitted from the display panel 100. Accordingly, a separate light shielding member of a cushioning tape 600 may be omitted from a display device according to the illustrated exemplary embodiment.

Figure 8:
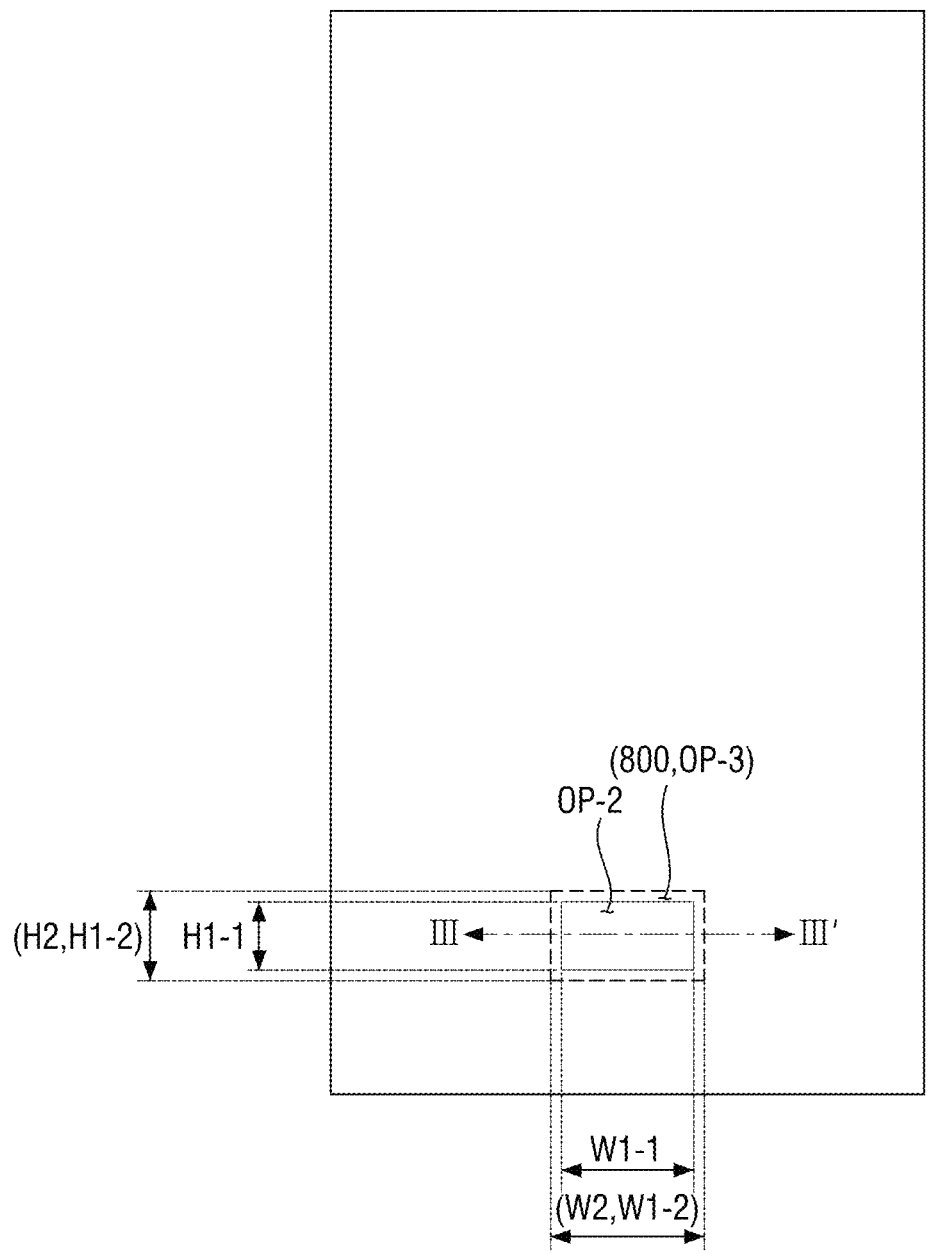
FIG. 8 is a plan view of a protective tape constructed according to an exemplary embodiment of the invention.
Figure 9:
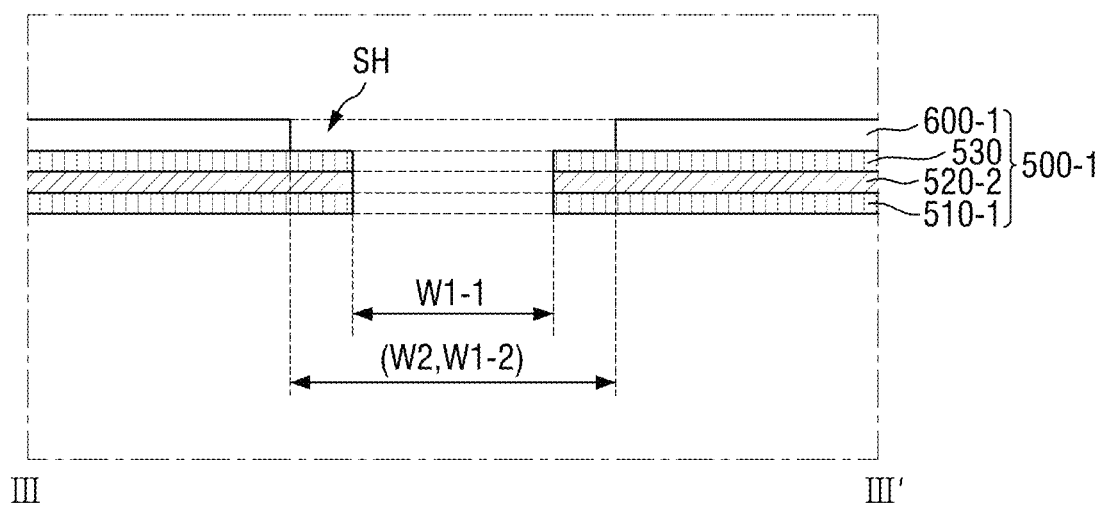
FIG. 9 is a cross-sectional view of the protective tape taken along sectional line III-III' of FIG. 8.

FIG. 8 is a plan view of a protective tape 500-1 construed according to an exemplary embodiment of the invention, and FIG. 9 is a cross-sectional view of the protective tape 500-1 taken along sectional line of FIG. 8.

Referring to FIGS. 8 and 9, the protective tape 500-1 according to the illustrated exemplary embodiment is different from the embodiment of FIG. 6 in that an opening OP-2 is smaller than a fingerprint sensor 800 and that the protective tape 500-1 further includes a second adhesive layer 530.

More specifically, a width W1-1 and a height H1-1 of the opening OP-2 formed in the protective tape 500-1 may be smaller than a width W2 and a height H2 of the fingerprint sensor 800. In some exemplary embodiments, the size of the opening OP-2 formed in the protective tape 500-1 may be the same as the size of an image sensor 820 of the fingerprint sensor 800. A width W1-2 and a height H1-2 of an opening OP-3 formed in a cushioning tape 600-1 may be the same as the width W2 and the height H2 of the fingerprint sensor 800. A lower surface of the substrate 110 may be exposed by the opening OP-2 formed in the protective tape 500-1 and the opening OP-3 formed in the cushioning tape 600-1, and the exposed part of the lower surface of the substrate 110 may directly face the fingerprint sensor 800.

A protective layer 520-2 illustrated in FIG. 9 may further include the second adhesive layer 530 on its lower surface, unlike the protective layer 520-1 illustrated in FIG. 7. The second adhesive layer 530 may be disposed between the protective layer 520-2 and the cushioning tape 600-1 and may completely overlap the protective layer 520-2. In addition, the second adhesive layer 530 may form a shoulder SH in the non-overlapping area with the cushioning tape 600-1. The fingerprint sensor 800 may be mounted on the shoulder SH in the non-overlap area. Thus, the misalignment of the fingerprint sensor 800 can be prevented or reduced. In addition, the protective layer 520-2 may further include a light shielding pigment. Since the fingerprint sensor 800 and the opening OP-3 of the cushioning tape 600-1 completely overlap each other, the visibility of a fingerprint sensor attachment portion SA1 can be reduced.

Figure 10:
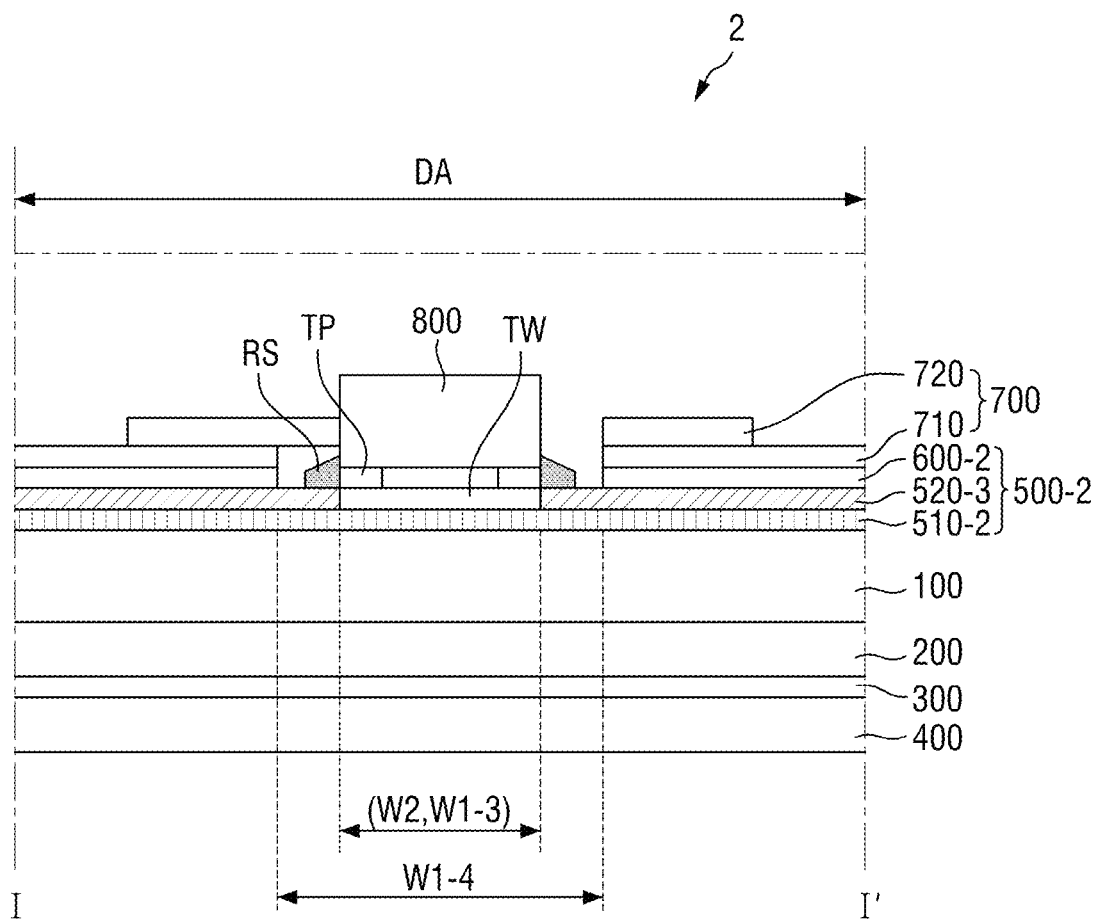
FIG. 10 is a cross-sectional view of a display device constructed according to an exemplary embodiment, taken along the sectional line I-I' of FIG. 2.
Figure 11:
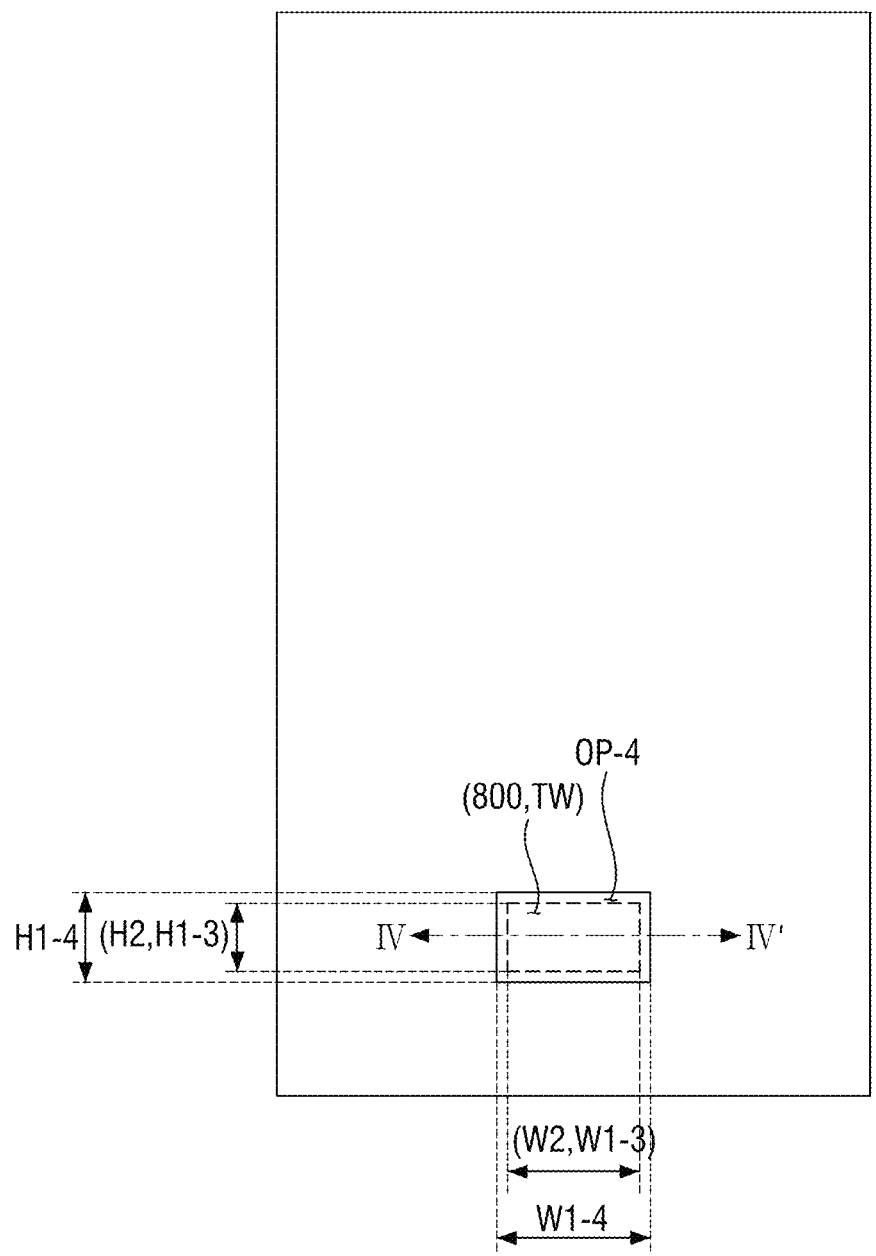
FIG. 11 is a plan view of a protective tape constructed according to an exemplary embodiment.

FIG. 10 is a cross-sectional view of a display device 2 construed according to an exemplary embodiment, taken along the sectional line I-I' of FIG. 2. FIG. 11 is a plan view of a protective tape 500-2 construed according to an exemplary embodiment, and FIG. 12 is a cross-sectional view of the protective tape 500-2 taken along sectional line IV-IV' of FIG. 11.

Figure 12:
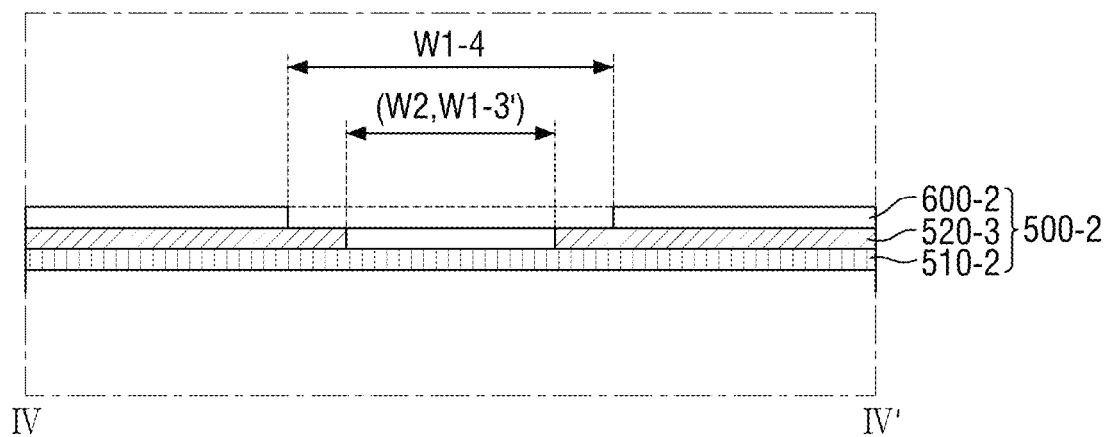
FIG. 12 is a cross-sectional view of the protective tape taken along sectional line IV-IV' of FIG. 11.

Referring to FIGS. 10, 11, and 12, the protective tape 500-2 according to the illustrated exemplary embodiment is different from the embodiment of FIG. 6 in that a protective layer 520-3 does not include an opening OP but includes a first area which is a transparent window area TW and a second area which is an opaque area.

More specifically, the display device 2 illustrated in FIG. 10 is different from the display device 1 illustrated in FIGS. 3A and 3B in that the protective tape 500-2 does not include an opening exposing the substrate 100. The protective layer 520-3 of the protective tape 500-2 may include the transparent window area TW in an area overlapping a fingerprint sensor 800 and a light shielding area in an area not overlapping the fingerprint sensor 800. A first adhesive layer 510-2 may be disposed between the protective layer 520-3 and a substrate 110. Since the transparent window area TW and the light shielding area are integrally formed in the protective layer 520-3, the first adhesive layer 510-2 may completely overlap the protective layer 520-3. In addition, a cushioning tape 600-2 may have an opening OP-4 overlapping the transparent window area TW. The opening OP-4 may be larger than the transparent window area TW.

The fingerprint sensor 800 may be bonded to a lower surface of the transparent window area TW by an adhesive member including the double-sided tape TP or the resin RS. Thus, the adhesive members TP and RS may be removed when the protective tape 500-2 is removed. That is, it is possible to prevent or reduce the damage to the protective tape 500-2 and reduce the time required to remove the adhesive members TP and RS.

Figure 13:
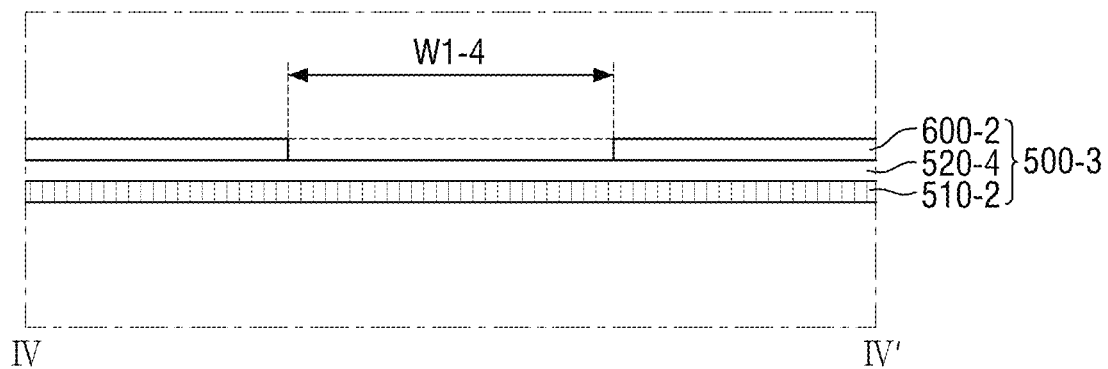
FIG. 13 is a cross-sectional view of an exemplary embodiment of another protective tape, taken along the sectional line IV-IV' of FIG. 11.

FIG. 13 is a cross-sectional view of an exemplary embodiment of another protective tape 500-3, taken along the sectional line IV-IV' of FIG. 11.

Referring to FIGS. 12 and 13, the protective tape 500-3 according to the illustrated exemplary embodiment is different from the embodiment of FIG. 12 in that both a first area and a second area are transparent.

More specifically, the entire area of a protective layer 520-4 illustrated in FIG. 13 may be transparent, unlike the protective layer 520-3 illustrated in FIG. 13. A cushioning tape 600-2 may be disposed on a lower surface of the protective tape 500-3. In some exemplary embodiments, the cushioning tape 600-2 may include a light shielding member that prevents or reduces light emitted from a display panel 100 from leaking to under the display panel 100. Therefore, if the entire area of the protective layer 520-4 is transparent, the process of dividing the entire area of the protective layer 520-4 into a transparent window area TW and a light shielding area can be reduced, thereby reducing manufacturing time and cost.

Figure 14:
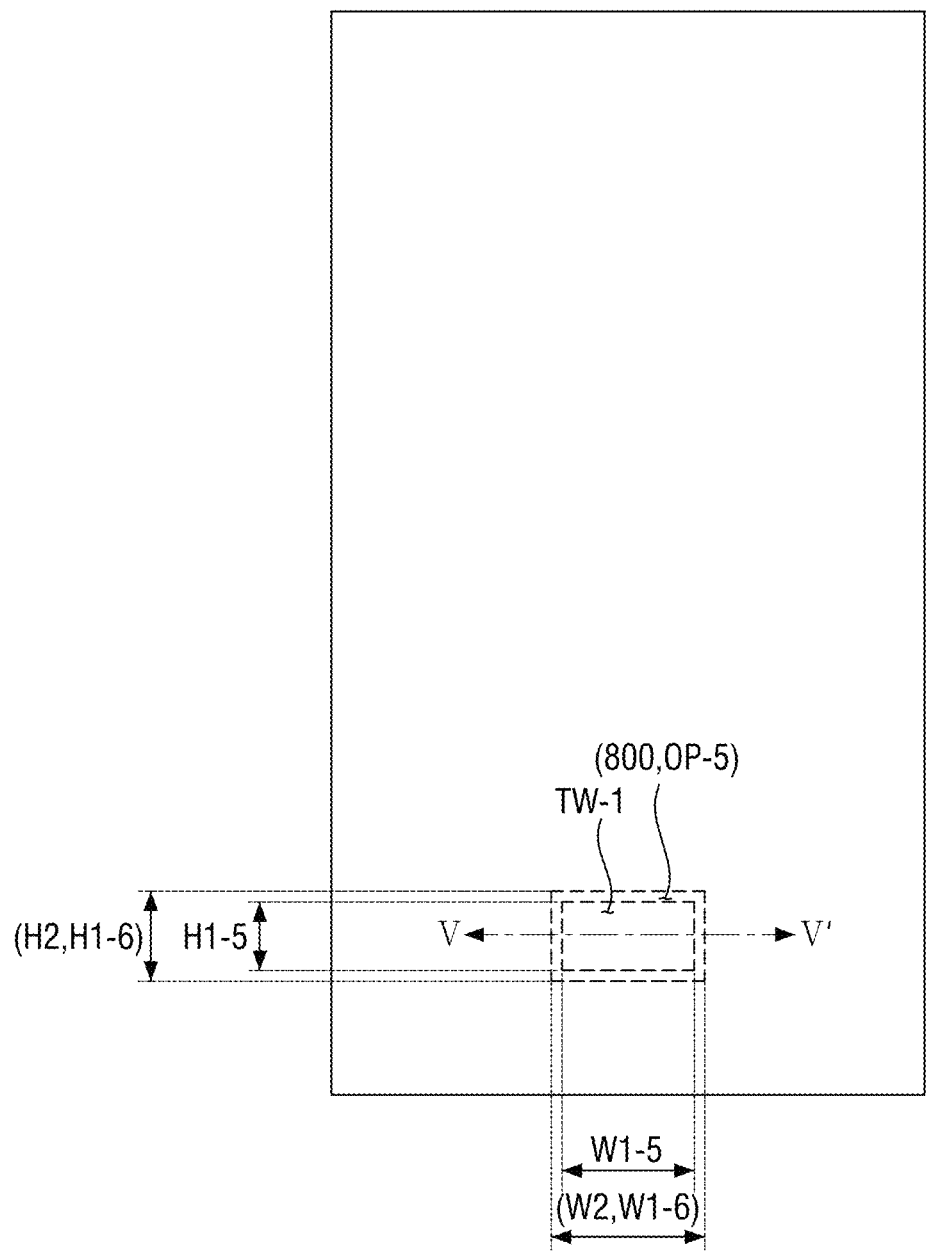
FIG. 14 is a plan view of a protective tape constructed according to an exemplary embodiment of the invention.
Figure 15:
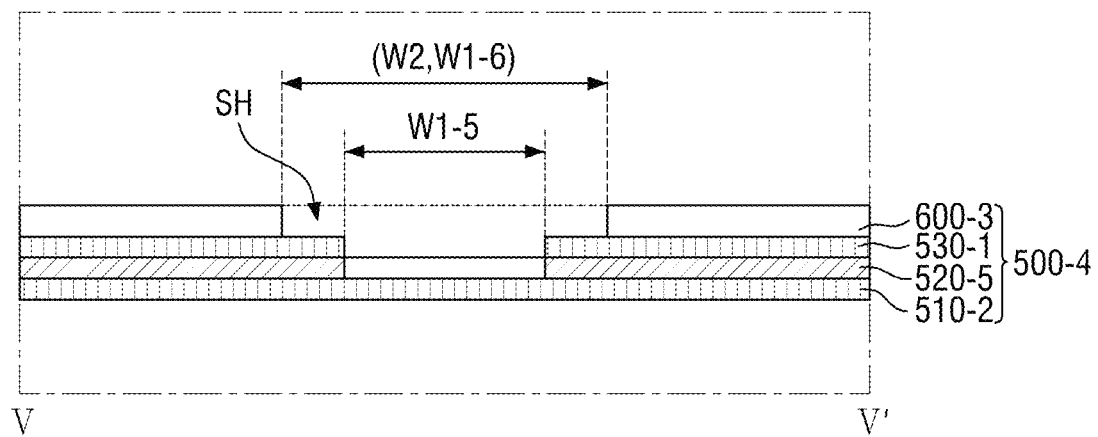
FIG. 15 is a cross-sectional view of the protective tape taken along sectional line V-V' of FIG. 14.

FIG. 14 is a plan view of a protective tape 500-4 construed according to an exemplary embodiment of the invention, and FIG. 15 is a cross-sectional view of the protective tape 500-4 taken along sectional line V-V' of FIG. 14.

Referring to FIGS. 14 and 15, the protective tape 500-4 according to the illustrated exemplary embodiment is different from the exemplary embodiment of FIG. 12 in that a transparent window area TW-1 is smaller than a fingerprint sensor 800 and that the protective tape 500-4 further includes a second adhesive layer 530-1.

More specifically, a width W1-5 and a height H1-5 of the transparent window area TW-1 formed in the protective tape 500-4 may be smaller than a width W2 and a height H2 of the fingerprint sensor 800. In some exemplary embodiments, the size of the transparent window area TW-1 formed in the protective tape 500-4 may be the same as the size of an image sensor 820 of the fingerprint sensor 800. A width W1-6 and a height H1-6 of an opening OP-5 formed in a cushioning tape 600-3 may be the same as the width W2 and height H2 of the fingerprint sensor 800.

Unlike the protective layers 520-3 and 520-4 illustrated in FIGS. 12 and 13, a protective layer 520-5 illustrated in FIG. 15 may further include the second adhesive layer 530-1 on its lower surface. The second adhesive layer 530-1 may be disposed between the protective layer 520-5 and the cushioning tape 600-3 and may completely overlap a light shielding area of the protective layer 520-5. In addition, the second adhesive layer 530-1 may form a shoulder SH in a non-overlap area with the cushioning tape 600-3. The fingerprint sensor 800 may be disposed in the shoulder SH in the non-overlap area. Thus, the misalignment of the fingerprint sensor 800 can be prevented or reduced. In addition, since the fingerprint sensor 800 and the transparent window area TW-1 of the protective layer 520-5 completely overlap each other, the visibility of a fingerprint sensor attachment portion SA1 can be reduced.

Figure 16:
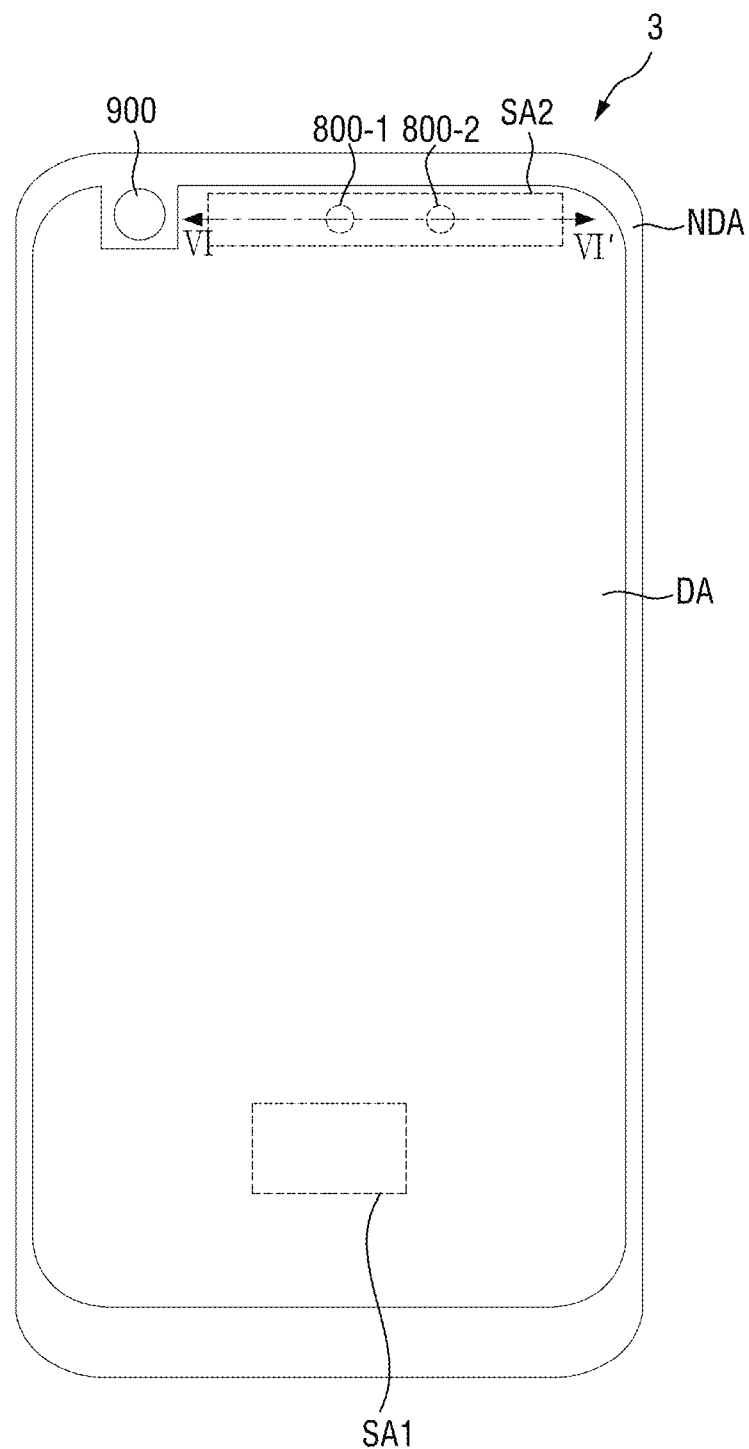
FIG. 16 is a plan view of a display device constructed according to another exemplary embodiment of the invention.
Figure 17:
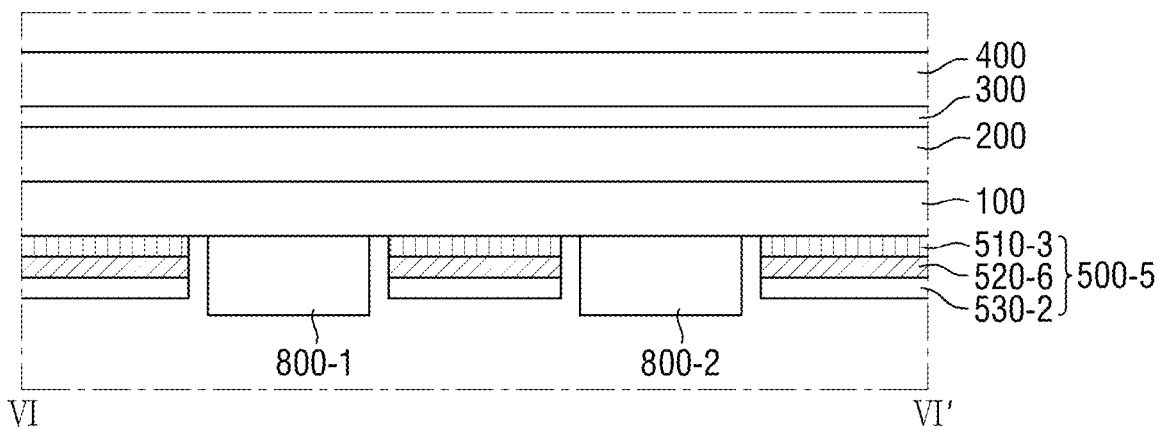
FIG. 17 is a cross-sectional view of the display device taken along line sectional VI-VI' of FIG. 16.

FIG. 16 is a plan view of a display device 3 construed according to another exemplary embodiment of the invention, and FIG. 17 is a cross-sectional view of the display device 3 taken along sectional line VI-VI' of FIG. 16.

Referring to FIGS. 16 and 17, the display device 3 according to the illustrated exemplary embodiment is different from the embodiment of FIG. 1 in that it further includes a second sensing area SA2 in a display area DA.

More specifically, the display device 3 may further include the second sensing area SA2 in the display area DA. The second sensing area SA2 may be disposed in a part of the display area DA which is adjacent to a non-display area NDA. In the second sensing area SA2, second optical sensors 800-1 and 800-2 such as an iris recognition sensor and a proximity sensor may be disposed.

A protective tape may further include second opening or second transparent window area which overlaps the second sensing area SA2. The second opening exposes a lower surface of a substrate 110. The second optical sensors 800-1 and 800-2 may be inserted into the second openings or the second transparent window areas. The second optical sensors 800-1 and 800-2 may directly face the lower surface of the substrate 110 exposed by the second opening.

Like a first optical sensor, the second optical sensors 800-1 and 800-2 may be mounted on a first flexible circuit board. In this case, the first flexible circuit board 710 may extend from a first sensing area SA1 to the second sensing area SA2. In the display device 1 according to the exemplary embodiment of FIG. 2, the first flexible circuit board 710 is disposed adjacent only to the first sensing area SA1. On the other hand, the first flexible circuit board of the display device 3 according to the illustrated embodiment of FIG. 16 may extend from the first sensing area SA1 to the second sensing area SA2.

When the second sensing area SA2 is disposed in the display area DA, the non-display area NDA can be reduced, thereby reducing a bezel. That is, the entire area of the display device 3 excluding an imaging device 900 using visible light can be utilized as the display area DA. Accordingly, since most of the area of the display device 3 can be used as the display area DA, a bezel-less display device with a minimized bezel can be realized.

In a display device according to an exemplary embodiment, the damage to a protective layer can be prevented or reduced.

In addition, in display devices according to embodiments, the visibility of a fingerprint sensor attachment portion can be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a display area;
   a flexible circuit board disposed on the display panel and having an opening therein;
   a protective cover disposed on a surface of the display panel between the display panel and the flexible circuit board in a position overlapping the display area, the opening extending through the protective cover, the protective cover overlapping the display area and extending in a thickness direction opposite from the display panel, the protective cover including a first layer; and
   a fingerprint sensor disposed at least partially in the opening.

2. The display device of claim 1, wherein the opening exposes at least a part of the surface of the display panel, and
   wherein the fingerprint sensor has a surface directly facing the display panel without any intervening layers.

3. The display device of claim 2, wherein the surface of the fingerprint sensor is directly disposed on the display panel.

4. The display device of claim 2, wherein the surface of the fingerprint sensor is spaced away from the display panel by an air gap.

5. The display device of claim 1, wherein the protective cover comprises a first adhesive layer disposed on a surface of the first layer facing the display panel.

6. The display device of claim 1, wherein the first layer comprises a light shielding pigment.

7. The display device of claim 1, wherein the display panel comprises a plurality of light emitting elements, and wherein the fingerprint sensor is configured to recognize a fingerprint of a user using the light emitted from the organic light emitting elements.

8. The display device of claim 1, wherein at least a part of the fingerprint sensor is inserted into the opening, facing the display panel.

9. The display device of claim 8, further comprising an adhesive member attaching the fingerprint sensor to the surface of the display panel, wherein the adhesive member is spaced apart from sidewalls of the opening.

10. The display device of claim 1, wherein the protective cover further comprises a second layer disposed on a surface of the first layer.

11. The display device of claim 10, wherein the opening comprises a first opening formed in the first layer and a second opening formed in the second layer,
    wherein the first opening has a planar surface area smaller than that of the fingerprint sensor, and
    wherein the second opening has a same planar surface area as that of the fingerprint sensor.

12. The display device of claim 11, further comprising a shoulder between the first and second layers,
    wherein the fingerprint sensor is attached to the shoulder.

13. The display device of claim 10, wherein the protective cover comprises a cover member including the first layer, which comprises protective tape, and the second layer which comprises a cushioning member including at least one of a heat dissipation member and a latent heat member.

14. The display device of claim 1, wherein the protective cover further comprises a third opening overlapping the display area.

15. The display device of claim 14, wherein at least one optical sensor is received in the third opening.

16. A display device comprising:
    a display panel having a display area;
    a flexible circuit board disposed on the display panel and having an opening therein;
    a protective cover disposed on a surface of the display panel, the protective cover comprising a first layer overlapping the display area; and
    a fingerprint sensor disposed on a surface of the protective cover, and at least partially in the opening,
    wherein the first layer comprises a first area and a second area surrounding the first area, the first area being a light transmitting area, and
    wherein the fingerprint sensor is disposed overlapping the first area and is co-planar with the protective cover.

17. The display device of claim 16, wherein the second area is an opaque area.

18. The display device of claim 16, wherein the protective cover comprises a first adhesive layer disposed on a surface of the first layer facing the display panel.

19. The display device of claim 16, wherein the display panel comprises a plurality of light emitting elements, and
    wherein the fingerprint sensor is configured to recognize a fingerprint of a user's finger positioned on the display panel using the light emitted from the organic light emitting elements.

20. The display device of claim 16, wherein at least a part of the fingerprint sensor is inserted into the protective cover overlapping the first area.

21. The display device of claim 20, further comprising a second layer disposed on the surface of the protective cover, the second layer comprising an opening overlapping the first area.

22. The display device of claim 21, wherein the first layer further comprises a second adhesive layer overlapping the second area facing the second layer, wherein the first area has a planar surface area smaller than that of the fingerprint sensor, and the opening has a planar surface area same as that of the fingerprint sensor.

23. The display device of claim 22, wherein the first layer comprises a non-overlap area which does not overlap with the second layer, and the fingerprint sensor is attached to the non-overlap area of the protective cover.

24. The display device of claim 21, wherein the protective cover comprises a cover member including the first layer, which comprises protective tape, and the second layer which comprises a cushioning member including at least one of a heat dissipation member and a latent heat member.

* * * * *